(12) United States Patent
Horie

(10) Patent No.: US 11,927,641 B2
(45) Date of Patent: Mar. 12, 2024

(54) BATTERY PACK AND ELECTRICAL DEVICE EMPLOYING SAME

(71) Applicant: Koki Holdings Co., Ltd., Tokyo (JP)

(72) Inventor: Yuki Horie, Shanghai (CN)

(73) Assignee: Koki Holdings Co., Ltd., Tokyo (JP)

( * ) Notice: Subject to any disclaimer, the term of this patent is extended or adjusted under 35 U.S.C. 154(b) by 445 days.

(21) Appl. No.: 17/292,715

(22) PCT Filed: Oct. 25, 2019

(86) PCT No.: PCT/JP2019/041957
§ 371 (c)(1),
(2) Date: May 10, 2021

(87) PCT Pub. No.: WO2020/100557
PCT Pub. Date: May 22, 2020

(65) Prior Publication Data
US 2022/0003825 A1 Jan. 6, 2022

(30) Foreign Application Priority Data
Nov. 16, 2018 (CN) .......................... 201811368058.6

(51) Int. Cl.
*G01R 31/396* (2019.01)
*G01R 31/3842* (2019.01)
(Continued)

(52) U.S. Cl.
CPC ....... *G01R 31/396* (2019.01); *G01R 31/3842* (2019.01); *H01M 10/425* (2013.01);
(Continued)

(58) Field of Classification Search
CPC ............. G01R 31/396; G01R 31/3842; H01M 10/425; H01M 10/482; H01M 2010/4271; H02J 7/0024; H02J 7/0047
See application file for complete search history.

(56) References Cited

U.S. PATENT DOCUMENTS 9,461,379 B2  10/2016  Cunanan et al.
2005/0110464 A1* 5/2005 Baker ............... H01M 8/04552
320/134

(Continued)

FOREIGN PATENT DOCUMENTS

JP  2006280171  10/2006
JP  2010110156   5/2010
(Continued)

OTHER PUBLICATIONS

"Office Action of Japan Counterpart Application" with English translation thereof, dated Dec. 28, 2021, p. 1-p. 6.
(Continued)

Primary Examiner — Manuel A Rivera Vargas
(74) Attorney, Agent, or Firm — JCIPRNET

(57) ABSTRACT

Provided is a battery pack in which the voltage of each battery cell is monitored using an inexpensive general-purpose microcomputer. A battery pack comprises: a plurality of battery cells connected in series; a plurality of voltage detection units which detect the voltage of each of the battery cells; and a microcomputer which measures the voltages of the battery cells from the output of each of the voltage detection units. Switch control circuits for switching on or off the outputs from the voltage detection units to the microcomputer are respectively arranged on each of the voltage detection units. Voltage divider circuits dividing the detected voltages into voltages lower than or equal to the power supply voltage of a control unit are arranged on the output sides of the voltage detection units. The microcomputer inputs the voltages divided by the voltage divider circuits and measures the voltages of the battery cells.

12 Claims, 11 Drawing Sheets

(51) Int. Cl.
  *H01M 10/42*   (2006.01)
  *H01M 10/48*   (2006.01)
  *H02J 7/00*    (2006.01)

(52) U.S. Cl.
  CPC ......... *H01M 10/48* (2013.01); *H01M 10/482* (2013.01); *H02J 7/0024* (2013.01); *H02J 7/0047* (2013.01); *H01M 2010/4271* (2013.01)

(56) References Cited

U.S. PATENT DOCUMENTS

| | | | | |
|---|---|---|---|---|
| 2010/0063757 | A1* | 3/2010 | Suzuki | H02J 7/00 320/134 |
| 2010/0289497 | A1* | 11/2010 | Lum-Shue-Chan | G01R 31/396 324/426 |
| 2012/0112755 | A1* | 5/2012 | Nishizawa | H01M 10/425 324/433 |

FOREIGN PATENT DOCUMENTS

| | | |
|---|---|---|
| JP | 2012016114 | 1/2012 |
| JP | 2017090152 | 5/2017 |
| WO | 2008013299 | 1/2008 |

OTHER PUBLICATIONS

"International Search Report (Form PCT/ISA/210) of PCT/JP2019/041957", dated Nov. 26, 2019, with English translation thereof, pp. 1-4.

"Search Report of Europe Counterpart Application", dated Jan. 20, 2022, p. 1-p. 8.

* cited by examiner non-charging mode

| mode | pattern | detection period | detection on time |
|---|---|---|---|
| charging | 1 | 5s | 1s |
| | 2 | 30s | 1s |
| | 3 | - | no detection |
| non-charging | 4 | 5s | 1s |
| | 5 | - | constantly ON |

BATTERY PACK AND ELECTRICAL DEVICE EMPLOYING SAME

CROSS-REFERENCE TO RELATED APPLICATION

This application is a 371 application of the international PCT application serial no. PCT/JP2019/041957, filed on Oct. 25, 2019, which claims the priority benefit of China application no. 201811368058.6, filed on Nov. 16, 2018. The entirety of each of the above—mentioned patent applications is hereby incorporated by reference herein and made a part of this specification.

BACKGROUND

Technical Field

The present invention relates to a detachable battery pack in which a plurality of battery cells are accommodated in a case, and relates to an electrical device employing the battery pack.

Related Art

In an electrical device such as a power tool that uses electric power to rotate a motor and converts the rotational motion of the motor into at least one of a reciprocating motion or a rotational motion of an operating member, a lighting equipment that emits light by electrical energy, an audio equipment that emits sound, or the like, a battery pack is widely used as a power supply. The battery pack includes a plurality of rechargeable battery cells, and these battery cells are accommodated in a case made of synthetic resin. A mechanism for mounting/removing on/from an electrical device main body using a battery-side rail unit and a terminal unit that enables electrical connection during mounting are arranged in the battery pack. On the other hand, a device-side rail unit for guiding the battery-side rail unit is arranged on the main body side of the electrical device. The electrical device which the battery pack is attached to or removed from extends to various devices such as an impact driver, a driver drill, a grinder, a sander, a nailing machine, a screwing machine, a tacker, a dust collector, a blower, a pump, a high pressure washer, a chainsaw, a mower, a pruner, a cultivator, a torch light, a radio, and the like. The battery pack is required to have a predetermined electric capacity and is required to be small and lightweight. Patent literature 1 is known as an example of the electrical device (power tool) using this battery pack.

LITERATURE OF RELATED ART

Patent Literature

Patent literature 1: Japanese Patent Laid-Open No. 2012-016114

SUMMARY

Problems to be Solved

The conventional battery pack shown in Patent literature 1 uses a dedicated battery protection IC to protect a lithium-ion battery. In addition, in order to perform various controls for discharging and charging the battery pack, it is effective to mount a microcomputer in the battery pack (hereinafter, it is referred as "microcomputer" in the specification). However, if a microcomputer is mounted in addition to the battery protection IC, the cost of the battery pack increases. On the other hand, although the dedicated battery protection IC with a microcomputer specialized in lithium-ion battery protection is commercially available, a significant increase in manufacturing cost is unavoidable due to the high price.

The present invention has been made in view of the above background, and an objective of the present invention is to provide a battery pack in which the voltage of each battery cell is monitored using an inexpensive general-purpose microcomputer, and provide an electrical device employing the battery pack. Another objective of the present invention is to provide a battery pack capable of suppressing power consumption associated with voltage monitoring of each battery cell, and provide an electrical device employing the battery pack. Furthermore, another objective of the present invention is to provide a battery pack capable of suppressing variation in the power consumption of each battery cell consumed during voltage monitoring and avoiding an imbalance in the voltage of each battery cell, and provide an electrical device employing the battery pack.

Means to Solve Problems

Typical features of the invention disclosed in the present application are described as follows. According to one feature of the present invention, a battery pack includes: a plurality of battery cells connected in series; a plurality of voltage detection units which detect a voltage of each of the battery cells; and a control unit having a microcomputer which measures the voltages of the battery cells from the output of each of the voltage detection units. Switch control circuits for switching on or off the outputs from the voltage detection units to the microcomputer are respectively arranged on the plurality of voltage detection units. Voltage divider circuits dividing the detected voltages into voltages lower than or equal to a power supply voltage of the control unit are respectively arranged on output sides of the voltage detection units. The microcomputer measures the voltages of the battery cells from the voltages divided by the voltage divider circuits. The plurality of battery cells include at least a first battery cell and a second battery cell from a ground side, and the plurality of voltage detection units are connected to a common ground. A first voltage detection unit detects the voltage of only the first battery cell, and a second voltage detection unit detects the combined voltage of the first battery cell and the second battery cell. In addition, the plurality of battery cells further include a third battery cell, the voltage detection units further include a third voltage detection unit, and the third voltage detection unit detects the combined voltage from the first battery cell to the third battery cell.

According to another feature of the present invention, the microcomputer has output ports corresponding to the plurality of voltage detection units, and a plurality of the switch control circuits are capable of being switched independently. In addition, the microcomputer has a plurality of input ports respectively corresponding to the plurality of voltage detection units, or has one input port commonly connected to the plurality of voltage detection units, and a charge or discharge stop signal is output to an external electrical device main body or an external charger based on signals input to the input port. A time interval of voltage detection performed by the plurality of voltage detection units is changed for each of the voltage detection units according to a state of the battery pack. For example, when the battery pack is being charged by the external charger, it is preferable to control voltage detection execution time taken by the voltage detection unit to be shorter than voltage detection stop time.

According to still another feature of the present invention, in a state that the battery pack is mounted on the external charger, a voltage detection interval of the voltage detection unit during charging execution is set to a time interval shorter than a voltage detection interval of the voltage detection unit during charging standby. In addition, after the charging of the battery pack is completed in the state that the battery pack is mounted on the external charger, the control unit does not detect the voltage by the voltage detection unit. Furthermore, during standby in which the battery pack is not discharged in a state that the battery pack is mounted on an electrical device main body, the voltage detection unit detects the voltage at a time interval shorter than the voltage detection stop time. Furthermore, when the battery pack is being discharged in the state that the battery pack is mounted on the electrical device main body, the voltage detection unit constantly detects the voltage at a regular interval. A battery pack with good performance at a low price can be realized by an electrical device having a battery pack mounting unit and mounting the battery pack described above.

According to still another feature of the present invention, a battery pack includes: a plurality of battery cells connected in series; a plurality of voltage detection units which detect the voltage of each of the battery cells; and a control unit having a microcomputer which measures the voltages of the battery cells from the output of each of the voltage detection units. Switch control circuits for switching on or off the outputs from the voltage detection units to the microcomputer are respectively arranged on the plurality of voltage detection units. Voltage divider circuits dividing the detected voltages into voltages lower than or equal to the power supply voltage of the control unit are respectively arranged on the output sides of the voltage detection units. The microcomputer has the same number of input ports respectively connected to the voltage detection units as the number of the battery cells, and has the same number of output ports respectively connected to the switch control circuits as the number of the battery cells. In addition, the plurality of battery cells include at least a first battery cell, a second battery cell, and a third battery cell from the ground side, and the plurality of voltage detection units are connected to a common ground. A first voltage detection unit detects the voltage of only the first battery cell, a second voltage detection unit detects the combined voltage of the first battery cell and the second battery cell, and a third voltage detection unit detects the combined voltage from the first battery cell to the third battery cell. The microcomputer unevenly detects the voltage by the first to third voltage detection units at non-uniform intervals.

Effect

According to the present invention, a voltage monitoring circuit is arranged for each battery cell voltage, the monitoring timing is independently switched for each battery cell under the control of the microcomputer, and thereby the low consumption of the circuit can be realized, and an imbalance in the voltage between the battery cells can be prevented.

DESCRIPTION OF THE EMBODIMENTS

Embodiment 1

Figure 3:
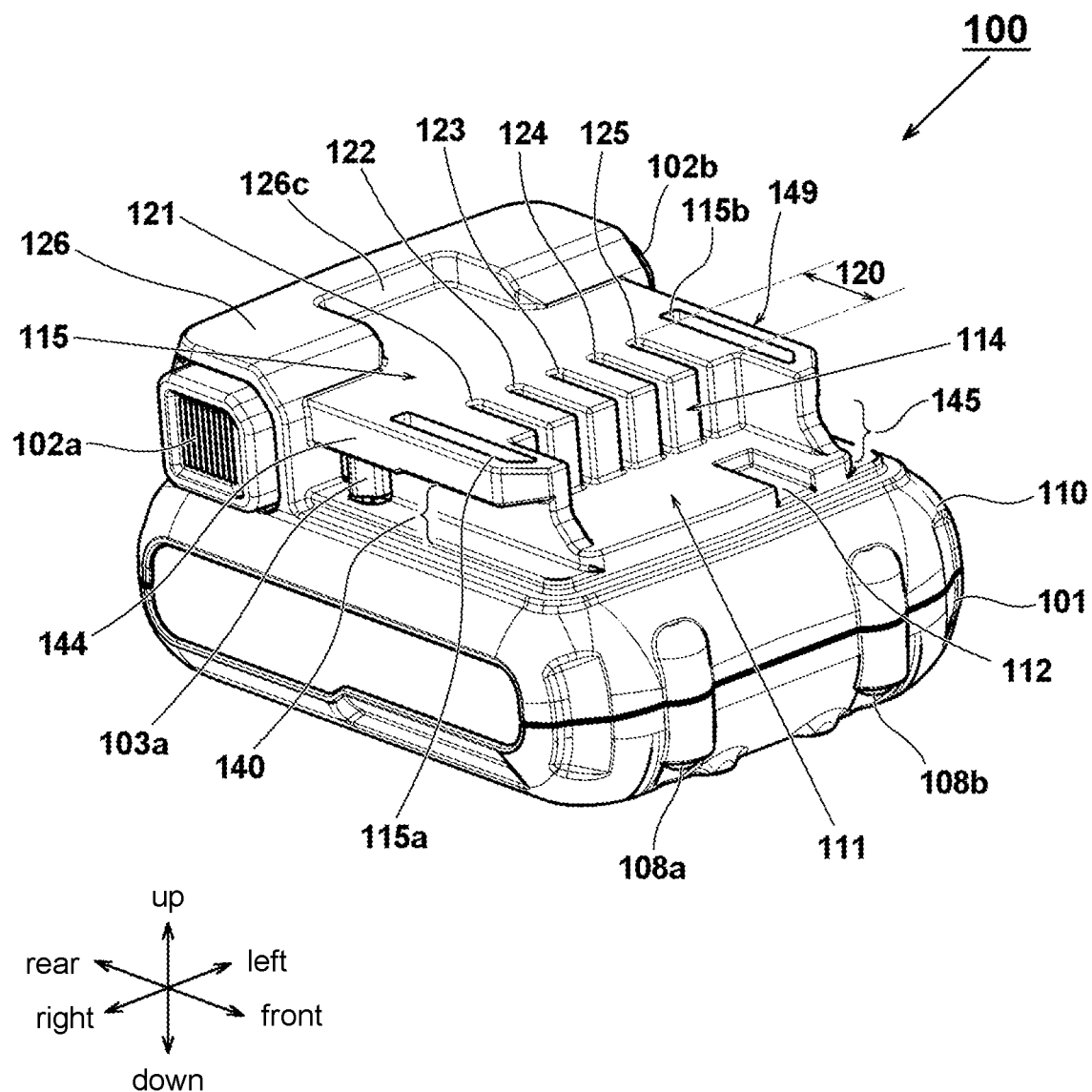
FIG. 3 is a perspective view of a battery pack 100 in FIG. 1.
Figure 4:
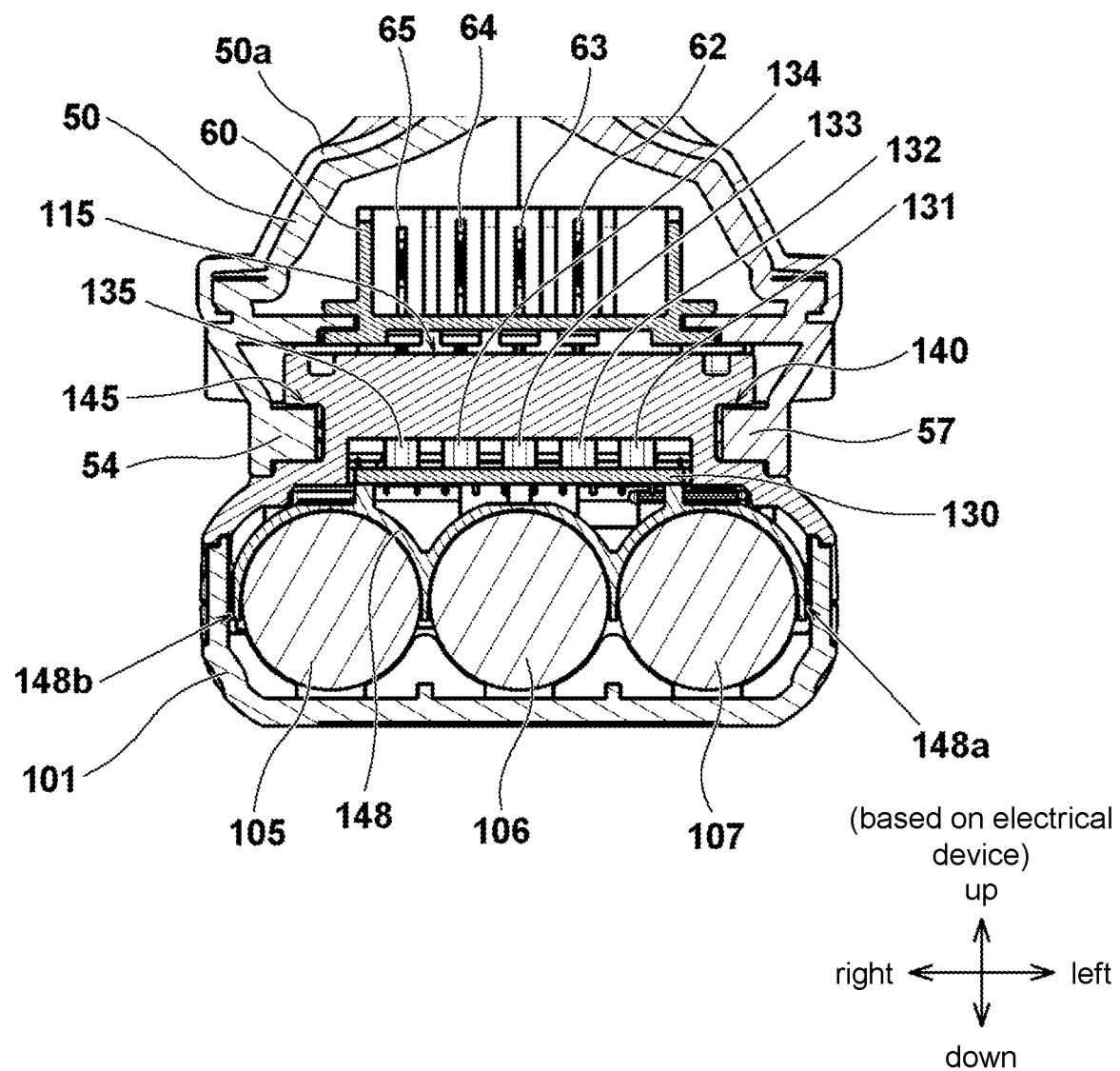
FIG. 4 is a cross-sectional view of an A-A part in FIG. 1.

Hereinafter, embodiments of the present invention are described with reference to the drawings. In the embodiment, an impact tool 1 is described as an example of an electrical device. Moreover, in the specification, the vertical direction of the impact tool 1 is described as the direction shown in the drawings, but the direction of a single battery pack is described as the front side and the rear side as shown in FIG. 3 and FIG. 4 with reference to the mounting direction of a battery pack 100.

Figure 1:
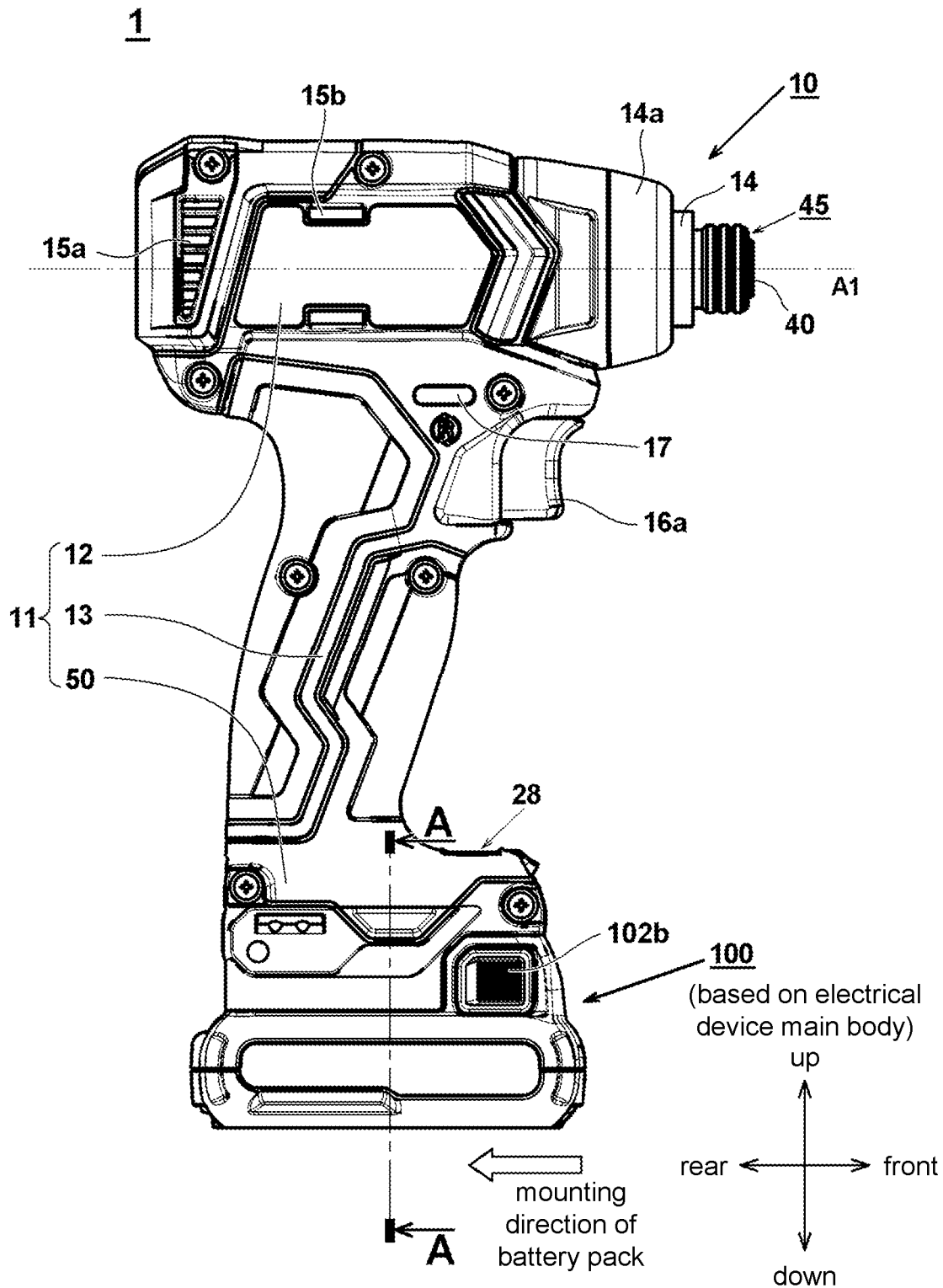
FIG. 1 is a right side view of an electrical device (impact tool 1) according to an embodiment of the present invention.

FIG. 1 is a side view of the impact tool 1 according to the embodiment of the present invention. The impact tool 1 is a kind of electrical device configured by a tool main body 10 and the battery pack 100 that can be attached to and detached from the tool main body 10. The impact tool 1 drives a rotary striking mechanism using the battery pack 100 that is rechargeable as a power supply and using a motor as a drive source. The rotary striking mechanism converts the rotation of the motor into an intermittent striking force caused by a hammer in the rotational direction, and drives a tip tool holding unit 45 connected to the striking mechanism unit. A main body housing 11 of the impact tool 1 is configured by three parts, that is, a body portion 12 formed in a cylindrical shape for accommodating the motor, a handle portion 13 which is a part to be gripped by an operator with one hand, and a battery pack mounting unit 50 arranged at the front end of the handle portion 13 for mounting the battery pack 100 that is detachable. The main body housing 11 is manufactured in a form of being divided into two parts on the left and right by molding a plastic synthetic resin, and is fixed to each other with a plurality of screws. The handle portion 13 extends downward in a manner of being substantially orthogonal to the central axis (rotation axis A1) of the body portion 12, and an operation lever (trigger lever 16a) of a trigger switch (described later in FIG. 2) for controlling on or off of the motor is arranged at a position where the index finger is located when the operator grips the handle portion 13. A forward/reverse switching lever 17 for switching the rotational direction of the motor is arranged on the upper rear side of the trigger lever 16a.

The battery pack mounting unit 50 is formed in the lower part inside the handle portion 13 for attaching the battery pack 100. The battery pack 100 that can be mounted and removed is mounted on the battery pack mounting unit 50. The battery pack 100 accommodates a plurality of secondary batteries such as lithium-ion batteries or the like, and is rated at 10.8 V in the embodiment from the viewpoint of the type and number of the accommodated battery cell. The battery pack 100 can be employed not only in the impact tool 1 but also in various electrical devices operating at the same rated voltage and having a common rail mechanism. When the voltage of the battery pack 100 drops, it is possible to remove the battery pack 100 from the tool main body 10 and set the battery pack 100 in an external charger (not shown) to be charged, thereby realizing repeated use of the battery pack 100.

An air suction port 15b formed as a plurality of slits is arranged at substantially the center of the side surface of the body portion 12 in the front-rear direction. In addition, an air discharge port 15a is arranged at a position separated from the air suction port 15b by a predetermined distance on the rear side. An anvil 40 extends from the front side of the body portion 12, and the tip tool holding unit 45 for holding tip tools is arranged at a front end part of the anvil 40.

Figure 2:
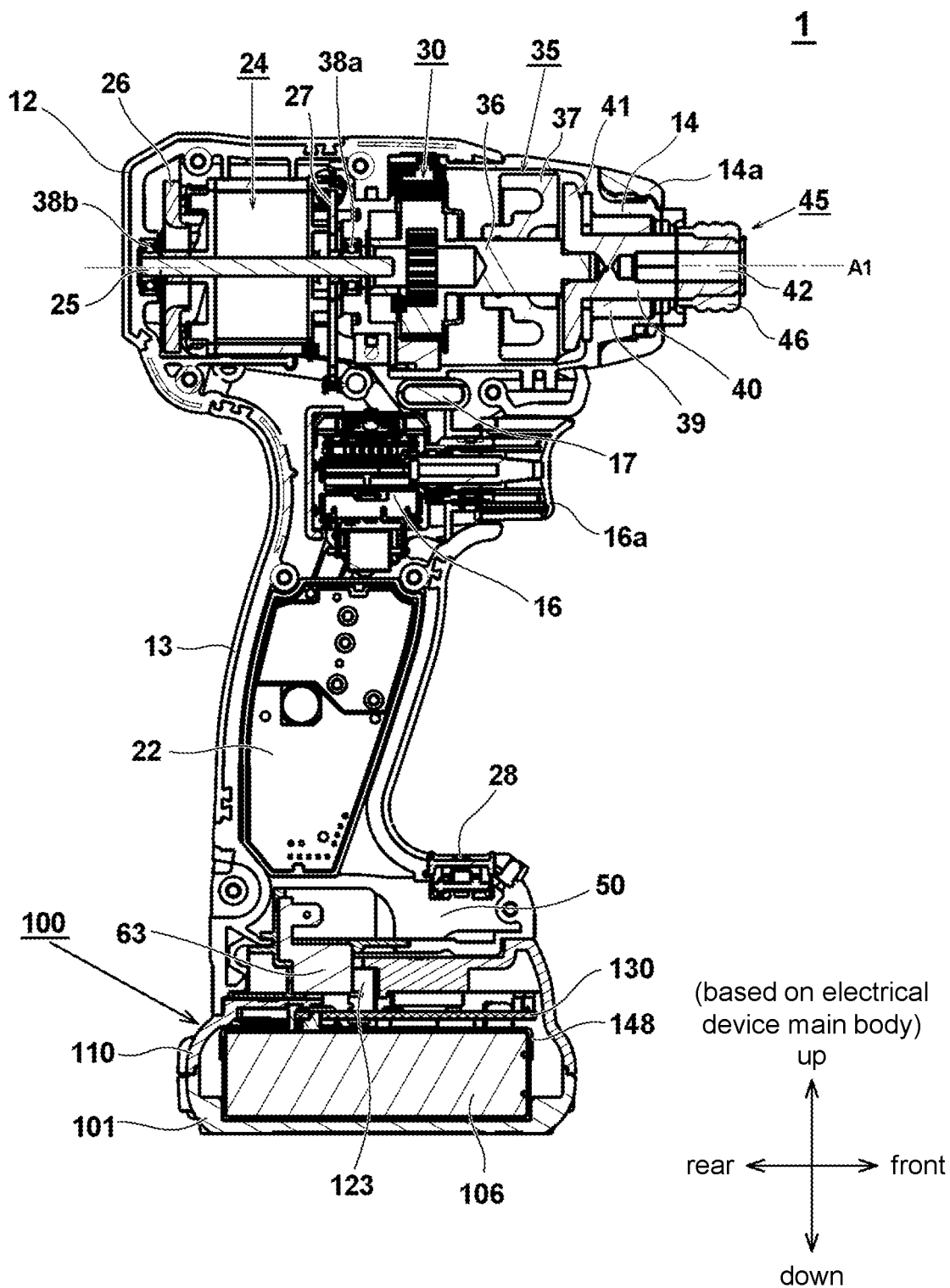
FIG. 2 is a vertical cross-sectional view of the impact tool 1 in FIG. 1.

FIG. 2 is a vertical cross-sectional view showing an internal structure of the impact tool 1 in FIG. 1. The housing of the impact tool 1 is configured by the main body housing 11 made of synthetic resin and divided into right and left parts (the body portion 12, the handle portion 13, and the battery pack mounting unit 50), and an integrated hammer case 14 made of metal for accommodating a striking mechanism 35. A protector 14a made of synthetic resin is mounted on the outer peripheral side of the tip of the hammer case 14. In the interior of the cylindrical body portion 12 and the hammer case 14, a motor 24, a speed reduction mechanism 30 using a planet gear, and the striking mechanism 35 having a hammer 37 and the anvil 40 are arranged side by side on the rotation axis A1.

A trigger switch 16 is arranged at the upper part of the handle portion 13, and the trigger lever 16a which is an operation unit is exposed from the trigger switch 16 to the front side of the main body housing 11. The trigger switch 16 includes a case having a built-in switch mechanism, and an operation unit (the trigger lever 16a) arranged externally for driving the switch mechanism. The trigger switch 16 is turned on and off by operating the trigger lever 16a.

A control circuit substrate 22, on which a control circuit having a function of controlling the speed of the motor 24 by pulling the trigger lever 16a is mounted, is accommodated in the interior of the handle portion 13. The control circuit substrate 22 is arranged in the vertical direction in a manner of being parallel to the central axis of the handle portion 13. A microcomputer (not shown), and a semiconductor switching element (not shown) for forming an inverter circuit are mounted on the control circuit substrate 22. A switch holder 28 equipped with an operation mode changeover switch and the like is arranged on the outer upper surface of the battery pack mounting unit 50. Various operation buttons such as a striking strength setting button, a remaining amount check button of the battery pack 100, and lamps and the like corresponding to the operation buttons are arranged in the switch holder 28.

A brushless DC motor is used as the motor 24, and the motor 24 is driven by an exciting current generated by the inverter circuit. A cooling fan 26 for cooling the motor 24 is arranged coaxially with a rotating shaft 25 on the rear side of the motor 24 in the axial direction. The rotating shaft 25 is pivotally supported by a bearing 38a on the front side of the stator core and a bearing 38b on the rear side of the stator core, and the cooling fan 26 is arranged between the bearing 38b and the stator core. The cooling fan 26 rotates in synchronization with the motor 24, and when the cooling fan 26 rotates, outside air is sucked from the air suction port 15b (see FIG. 1) at the center of the main body housing 11, the motor 24 is cooled, and the air after cooling is discharged to the outside from the air discharge port 15a (see FIG. 1).

A sensor substrate 27 on which three Hall ICs (not shown) are mounted is arranged between the stator core and the bearing 38a on the front side of the motor 24 in the axial direction. The motor 24 is star-connected, and an end part of a coil (not shown) wound around the stator core is connected to the wiring pattern of the sensor substrate 27 by soldering.

The speed reduction mechanism 30 decelerates the output of the motor 24 at a predetermined speed reduction rate and transmits the output to a spindle 36. Here, a known speed reduction mechanism using a planet gear is used. The spindle 36 is connected to the output side of the speed reduction mechanism 30, a spindle cam groove (not shown) is formed on the outer peripheral surface of the spindle 36, and a planetary carrier unit of the speed reduction mechanism 30 is formed on the rear side of the shaft part of the spindle 36.

The hammer 37 is arranged on the outer peripheral side of the shaft part of the spindle 36, and a hammer cam groove is formed on the inner peripheral side of the shaft part of the spindle 36. The hammer 37 is held by a cam mechanism using a steel ball (not shown), and the outer peripheral surface of the spindle 36 and a part of the inner peripheral surface of the hammer 37 come into contact with each other. Moreover, the cam mechanism is not shown in FIG. 2. When the reaction force received from the tip tool is low, the hammer 37 rotates in conjunction with the rotation of the spindle 36, but when the reaction force received from the tip tool becomes large, a cam ball of the cam mechanism (not shown) moves, and thereby the relative positions of the hammer 37 and the spindle 36 in the rotational direction slightly change, and the hammer 37 moves significantly to the rear side. Because the hammer 37 is constantly urged to the front side by a hammer spring (not shown), the hammer 37 moves toward the rear side while compressing the hammer spring (not shown).

At the rear end of the anvil 40, two blade portions 41 to be struck are formed at positions separated by 180 degrees in the circumferential direction. The blade portion 41 has a shape extending outward in the radial direction, and is struck by a striking claw of the hammer 37. The side surface of the blade portion 41 in the rotational direction includes two surfaces, that is, a struck surface that is struck when the hammer 37 rotates in the tightening direction, and a struck surface that is formed on the opposite side and is struck when the hammer 37 rotates in the loosening direction. The rotating body of the spindle 36 and the anvil 40 is pivotally supported on the hammer case 14 by a metal 39 on the front side. The tip tool holding unit 45 includes a mounting hole 42 having a hexagonal cross section and extending axially rearward from the front end part of the anvil 40, and a sleeve 46 that moves back and forth on the outer peripheral side of the anvil 40.

A casing of the battery pack 100 is formed by an upper case 110 and a lower case 101, and inside the space formed by the upper case 110 and the lower case 101, three battery cells 105 to 107 (only 106 can be seen in the diagram) are arranged side by side in the horizontal direction in a manner that the axes are oriented in the front-rear direction. A circuit substrate 130 is horizontally arranged on the upper side of the battery cell 106, and a plurality of battery side terminals (D terminal 123, and the like) are arranged upward from the circuit substrate 130 and are fitted with input terminals (D terminal 63, and the like) on the power tool main body side.

FIG. 3 is a perspective view of the battery pack 100 according to the embodiment of the present invention. The battery pack 100 can be attached to and detached from the battery pack mounting unit 50 (see FIG. 1). The lower case 101 and the upper case 110 are fixed to each other by a member that does not conduct electricity, for example, four screws 108a, 108b and the like that are made of synthetic resin. In order to be attached to the battery pack mounting unit 50, the upper case 110 is formed with a rail mechanism in which two rail grooves 140 and 145 are formed. The rail grooves 140 and 145 are grooves having a shape in which the longitudinal direction is parallel to the mounting direction of the battery pack 100 and the rail grooves are recessed inward from left and right side surfaces 144 and 149 of the upper case 110. The front side ends of groove parts of the rail grooves 140 and 145 are open ends, and the rear side ends are closed ends connected to the front side wall surface of a raised part 126. The rail grooves 140 and 145 are formed in a shape corresponding to rails (not shown) formed in the battery pack mounting unit 50 of the tool main body 10, and in a state that the rail grooves 140 and 145 are fitted with the rails of the tool main body 10, the battery pack 100 is fixed to the tool main body 10 by being locked by latch claws 103a and 103b (103b cannot be seen in FIG. 3). When the battery pack 100 is removed from the tool main body 10, because the locked state is released by inwardly pushing latches 102a and 102b on both the left and right sides, the battery pack 100 is moved to a side opposite to the mounting direction in the unlocked state.

A flat lower stage surface 111 is formed on the front side of the upper case 110, and an upper stage surface 115 formed higher than the lower stage surface 111 is formed near the center of the upper case 110. The lower stage surface 111 and the upper stage surface 115 are formed in a stepped shape, and the connecting part thereof is a stepped part 114 which is a vertical surface. The front side part of the upper stage surface 115 from the stepped part 114 becomes a slot group arrangement area 120. In the slot group arrangement area 120, a plurality of slots 121 to 125 are formed in a manner of extending rearward from the front stepped part 114. The slots 121 to 125 are notched parts having a predetermined length in the battery pack mounting direction, and inside the notched parts, a plurality of battery side terminals 131 to 135 (described later in FIG. 4) that can be fitted with device side terminals of the tool main body 10 or an external charging apparatus (not shown) are arranged. The slots 121 to 125 are formed in a manner that terminals on the power tool main body side can be inserted by being slid from the lower stage surface 111 side to the rear side.

In the slots 121 to 125, the slot 121 on the right side of the battery pack 100 near the rail groove 140 serves as an insertion port for a positive electrode terminal for charging (C+ terminal). The slot 122 adjacent to the slot 121 serves as an insertion port for a positive electrode terminal for discharging (+ terminal). In addition, the slot 124 on the left side of the battery pack 100 serves as an insertion port of a negative electrode terminal (− terminal). In addition to the positive and negative terminals, two signal terminals for signal transmission used for controlling the battery pack 100, the tool main body 10 and an external charging apparatus (not shown). Here, the slot 123 for a D terminal for receiving activation signals of the tool main body 10 or the external charger and exchanging the transmission/reception signal with respect to the microcomputer on the battery pack side, and the slot 125 for a LD terminal that outputs an abnormal stop signal (discharge stop signal or charge stop signal) from the microcomputer in the battery pack 100 are arranged.

On the rear side of the upper stage surface 115, the raised part 126 is formed in a manner that the outer shape of the raised part 126 is raised above the upper stage surface 115. A recessed stopper part 126c is formed near the center of the raised part 126. The stopper unit 126c is a surface that abuts against a protrusion (not shown) of the battery pack mounting unit 50 when the battery pack 100 is mounted. When the battery pack 100 is mounted on the tool main body 10, a plurality of terminals (device side terminals) arranged on the tool main body 10 and a plurality of connection terminals (not shown) arranged on the battery pack 100 are in good contact with each other and come into a conductive state. In addition, the latch claws 103a and 103b (103b cannot be seen in the diagram) act to fix the tool main body 10 and the battery pack 100. Hollowed parts 115a and 115b for facilitating injection molding are formed on the upper stage surface 115 at the parts upper than the rail grooves 140 and 145.

A recessed part 112 being a substantially rectangular parallelepiped when viewed from above is formed on the front side of the lower stage surface 111. The recessed part 112 is a concave-convex part used for identifying the suitability of mounting the battery pack 100 on the tool main body 10, and engages with a protrusion (not shown) formed on the tool main body 10 side.

FIG. 4 is a cross-sectional view of the A-A part in FIG. 1. The battery pack 100 accommodates three lithium-ion batteries rated at 3.6 V in a space defined by aligning an opening part of the upper case 110 having an opening on the lower side and an opening part of the lower case 101 having an opening on the upper side. The battery cells 105 to 107 to be used are known as a battery cell of 18650 size having a diameter of 18 mm and a length of 65 mm. However, battery cells of other sizes and shapes may also be used. The battery cells 105 to 107 are substantially accommodated in the lower case 101 in a manner of making sure that the axial direction is the front-rear direction, and the battery cells 105 to 107 are stably fixed by covering the upper part with a separator 148 made of synthetic resin.

The separator 148 is manufactured by integrally molding synthetic resin such as plastic or the like, which is a non-conductor material, and the upper part of the separator 148 functions as a mounting base for holding the circuit substrate 130. The separator 148 is shaped to cover the upper half surface of the outer peripheral surfaces of the battery cells 105 to 107, and junction surfaces 148a and 148b in contact with the inner wall surface of the lower case 101 are formed at left and right ends of the separator 148. The circuit substrate 130 serves as a mounting base for soldering a plurality of battery side terminals 131 to 135, and mounts circuit components for battery control such as a microcomputer and the like. Although not visible in the AA cross section in FIG. 4, a screw hole is formed in the circuit substrate 130, and the circuit substrate 130 is fixed to the separator 148 by a screw (not shown).

Rails 54 and 57 which project inward from inner wall parts on both left and right sides and in which the longitudinal direction extends in the front-rear direction are formed in the battery pack mounting unit 50 of the tool main body 10. A terminal unit 60 is fixed to the bottom of the battery pack mounting unit 50 and above a space sandwiched between the rails 54 and 57 when viewed in the left-right direction. An elastic member 50a such as an elastomer or the like is arranged on the outer peripheral surface of the battery pack mounting unit 50 in a manner of being continuous with the outer peripheral surface of the handle portion 13.

The rails 54 and 57 are formed extending in the front-rear direction, and each of the rails 54 and 57 has an upper surface and a lower surface. The upper surfaces and the lower surfaces of the rails 54 and 57 are in contact with inner upper walls and inner lower walls of the rail grooves 140 and 145 of the battery pack 100 and engaged with each other. The terminal unit 60 is manufactured by integrally molding a non-conductive material such as synthetic resin or the like, and a plurality of metal terminals, for example, a positive electrode input terminal 62, the D terminal 63, a negative electrode input terminal 64, and a LD terminal (abnormal stop terminal) 65 are cast therein. The battery side terminals 131 to 135 corresponding to the terminal unit 60 are located in the inner space of the slots 121 to 125 (see FIG. 3).

Figure 5:
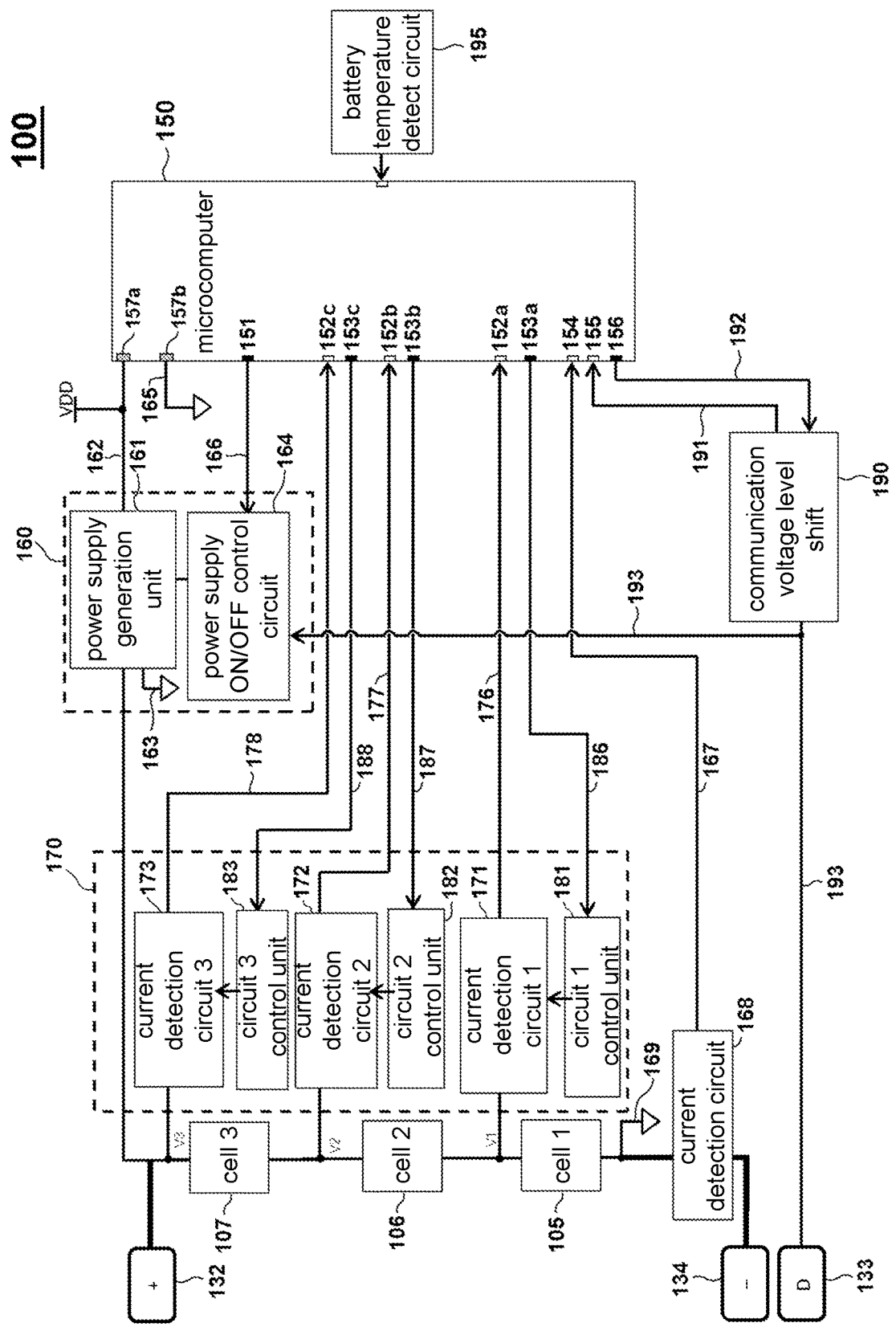
FIG. 5 is a block diagram showing the outline of an internal circuit of the battery pack 100 of the embodiment.

FIG. 5 is a block diagram showing a circuit configuration of the battery pack 100 having a microcomputer 150. When the battery pack 100 is mounted on the tool main body 10, the positive electrode input terminal 62, the negative electrode input terminal 64 and the D terminal 63 on the tool main body 10 side shown in FIG. 4 are connected to battery side terminals (a positive electrode terminal 132, a negative electrode terminal 134, and a D terminal 133) of the battery pack 100. The secondary batteries included in the battery pack 100 are three lithium-ion battery cells 105 to 107, the output on the positive electrode side of the series connection of these battery cells is connected to the positive electrode terminal 132, and the output on the negative electrode side is connected to the negative electrode terminal 134. A current detection circuit 168 is arranged in the series connection circuit of the battery cells 105 to 107, and the output of the current detection circuit 168 is input to an input port 154 of the microcomputer 150 using a signal line 167. There are various configurations of the current detection circuit 168, but the simplest configuration may be that a shunt resistor (not shown) is interposed in the series connection circuit of the battery cells 105 to 107, and the voltages between both ends of the battery cells 105 to 107 are input to the input port 154 of the microcomputer 150 via the signal line 167. In that case, two signal lines 167 are required, and two input ports 154 having an A/D conversion function are required. Because the negative electrode side of the first battery cell 105 is grounded by an earth wire 169, the potential of the negative electrode side of the first battery cell 105 becomes ground potential.

The microcomputer 150 performs predetermined arithmetic processing according to a program, and a commercially available general-purpose one-chip microcomputer can be used. Although not shown here, the microcomputer 150 includes a central processing unit (CPU), a timer used for time measurement in arithmetic processing in the CPU, a read only memory (ROM) for executing a program executed by the CPU, a random access memory (RAM) used for a work area and the like of arithmetic processing in the CPU, and the like. A plurality of input ports (152a to 152c, 154 and 155) are arranged in the microcomputer 150, and an analog signal that has been input is converted into a digital signal (A/D conversion) by the microcomputer 150. Furthermore, a plurality of output ports (151, 153a to 153c and 156) are arranged in the microcomputer 150, and an instruction signal (the digital signal) from the CPU is output as an analog signal (a predetermined voltage value).

A voltage detection unit 170 including a first voltage detection circuit 171, a second voltage detection circuit 172 and a third voltage detection circuit 173 is connected to the positive electrode side terminals of the three battery cells 105 to 107. The voltage detection unit 170 is configured by the first voltage detection circuit 171, the second voltage detection circuit 172, the third voltage detection circuit 173, a first circuit control unit 181, a second circuit control unit 182, and a third circuit control unit 183. The outputs of the first voltage detection circuit 171, the second voltage detection circuit 172 and the third voltage detection circuit 173 are connected to the input ports 152a to 152c of the microcomputer 150. Although not shown, because the first voltage detection circuit 171, the second voltage detection circuit 172 and the third voltage detection circuit 173 are also connected to the ground potential (described later in FIG. 6), these voltage detection circuits output a voltage signal proportional to the voltage difference with the ground potential to the microcomputer 150 by signal lines 176 to 178. The first voltage detection circuit 171, the second voltage detection circuit 172 and the third voltage detection circuit 173 do not constantly send the detection output to the microcomputer 150, but operates within a time window during which voltage detection is turned on using the first circuit control unit 181, the second circuit control unit 182 and the third circuit control unit 183, and sends out voltage signals of the signal lines 176 to 178. That is, the input signals of the first circuit control unit 181, the second circuit control unit 182 and the third circuit control unit 183 are input from the output ports 153a to 153c of the microcomputer 150 by signal lines 186 to 188, and the first circuit control unit 181, the second circuit control unit 182 and the third circuit control unit 183 function as switch control circuits.

An activation signal (a gate signal described later) to the first voltage detection circuit 171 is input via the signal line 186, and the output of the first voltage detection circuit 171 is sent to the microcomputer 150 via the signal line 176 only during the period when the gate signal is input. Similarly, the second voltage detection circuit 172 and the third voltage detection circuit 173 are also respectively controlled to be on or off by the second circuit control unit 182 and the third circuit control unit 183. Because the three output ports (D/A ports) 153a to 153c of the microcomputer 150 are assigned for signal transmission to the first voltage detection circuit 171, the second voltage detection circuit 172 and the third voltage detection circuit 173, the on/off control using the first circuit control unit 181, the second circuit control unit 182 and the third circuit control unit 183 can be controlled independently of the microcomputer 150. Moreover, in the battery pack 100 of the embodiment, three battery cells (105 to 107) are used, but when the number of the battery cell is set to n (where n is a natural number), n of the plurality of output ports (D/A ports) of the microcomputer 150 is assigned for the control of the circuit control unit. A battery temperature detection circuit 195 includes a thermistor attached to, for example, the outer periphery of any one of the battery cells, such as the outer periphery of the cell 106 arranged at the center of the three cells, and the output of the battery temperature detection circuit 195 is output to the microcomputer 150.

A power supply circuit unit 160 generates a power supply VDD for operating the microcomputer 150, for example, a constant DC voltage of 3.3 V, and supplies the power supply VDD to the microcomputer 150. A power supply generation unit 161 generates a constant voltage of 3.3 V from a ground potential 163 on the positive electrode side of the third battery cell 107, and supplies the constant voltage to the microcomputer 150. A power supply ON/OFF control circuit 164 is a circuit for activating (turning on) the power supply generation unit 161. When a high signal is sent from the power supply ON/OFF control circuit 164, the power supply generation unit 161 is turned on, and when the high signal is extracted, the power supply generation unit 161 is turned off. That is, the power supply ON/OFF control circuit 164 functions as a switch for activating or stopping the power supply generation unit 161, and when an activation signal is input from the D terminal 133 via a signal line 193, the power supply ON/OFF control circuit 164 activates the power supply generation unit 161.

Immediately after the battery pack 100 is mounted on an external connection device (not shown), or after a microcomputer of an external connection device is activated from the sleep state, the signal input to the D terminal 133 of the battery pack 100 is the operating voltage of the microcomputer (for example, 3.3 V or 5 V) when the external connection device is a device with a microcomputer, and the signal input to the D terminal 133 of the battery pack 100 is, for example, the voltage of a battery pack connected to the external connection device (10.8 V in the embodiment) when the external connection device is a device with a microcomputer. Therefore, the microcomputer 150 can identify that the external connection device has been activated by the fact that a voltage equal to or higher than the predetermined voltage is applied to the D terminal 133, and the power supply ON/OFF control circuit 164 to which the activation signal has been input activates the power supply generation unit 161 to supply the power supply to the microcomputer 150 and activate the microcomputer 150. Two power supply ports 157a and 157b are arranged in the microcomputer 150, one of which is connected to a power line 162 of +3.3 V, and the other of which is grounded via an earth wire 165.

A communication voltage level shift 190 is a circuit that generates a voltage change for communication in order to communicate with the tool main body 10 shown in FIG. 1 or the external connection device such as an external charger (not shown) or the like. The output of the communication voltage level shift 190 is connected to the input port (an A/D port) 155 of the microcomputer by a signal line 191 (for the microcomputer 150 to receive signals), and the input of the communication voltage level shift 190 is connected to the output port (a D/A port) 156 of the microcomputer by a signal line 192 (for the microcomputer 150 to transmit signals).

Here, the microcomputer 150 is activated when receiving the supply of the reference voltage VDD from the power supply circuit unit 160, and continues to output a power supply holding signal 166 from the output port 151. Thereby, the microcomputer 150 can maintain the power supply circuit unit 160 in the ON state even when the signal line 193 from the external connection device reaches a low level. On the other hand, even when the microcomputer 150 is removed from the external connection device at the time of activation and the signal of the signal line 193 disappears or drops to a low level, the operation of the power supply circuit unit 160 can be continued. Furthermore, the microcomputer 150 can stop the operation of the power supply circuit unit 160 and shut down itself by cutting off the output of the power supply holding signal 166 according to the own judgement of the microcomputer 150.

The microcomputer 150 detects and monitors the voltage between both ends of each battery cell using the outputs of the first voltage detection circuit 171, the second voltage detection circuit 172 and the third voltage detection circuit 173, and performs discharge and charge management. Here, the microcomputer 150 also includes functions such as a function of balancing cells, a function of detecting disconnection, and the like. However, as a specific control method for charge/discharge management of the battery cells 105 to 107, a known battery management method may be used, and thus detailed description thereof is omitted here. Moreover, the microcomputer 150 has a function of stopping the operation on the tool main body 10 side or stopping the charging of the external charger via the LD terminal 135 (see FIG. 4) when an abnormal state such as overcurrent, abnormal overheating or the like is detected. However, in the circuit diagram of FIG. 5, the LD terminal 135 and the output port of the microcomputer 150 corresponding to the LD terminal 135 are not shown. As described above, by playing the role of a so-called battery protection IC, the microcomputer 150 controls both charging and discharging in a manner of measuring the voltages of the first battery cell 105, the second battery cell 106 and the third battery cell 107, measuring the magnitude of the current flowing through the battery cell from the output of the current detection circuit 168, and keeping the first battery cell 105, the second battery cell 106 and the third battery cell 107 at a normal state.

Figure 6:
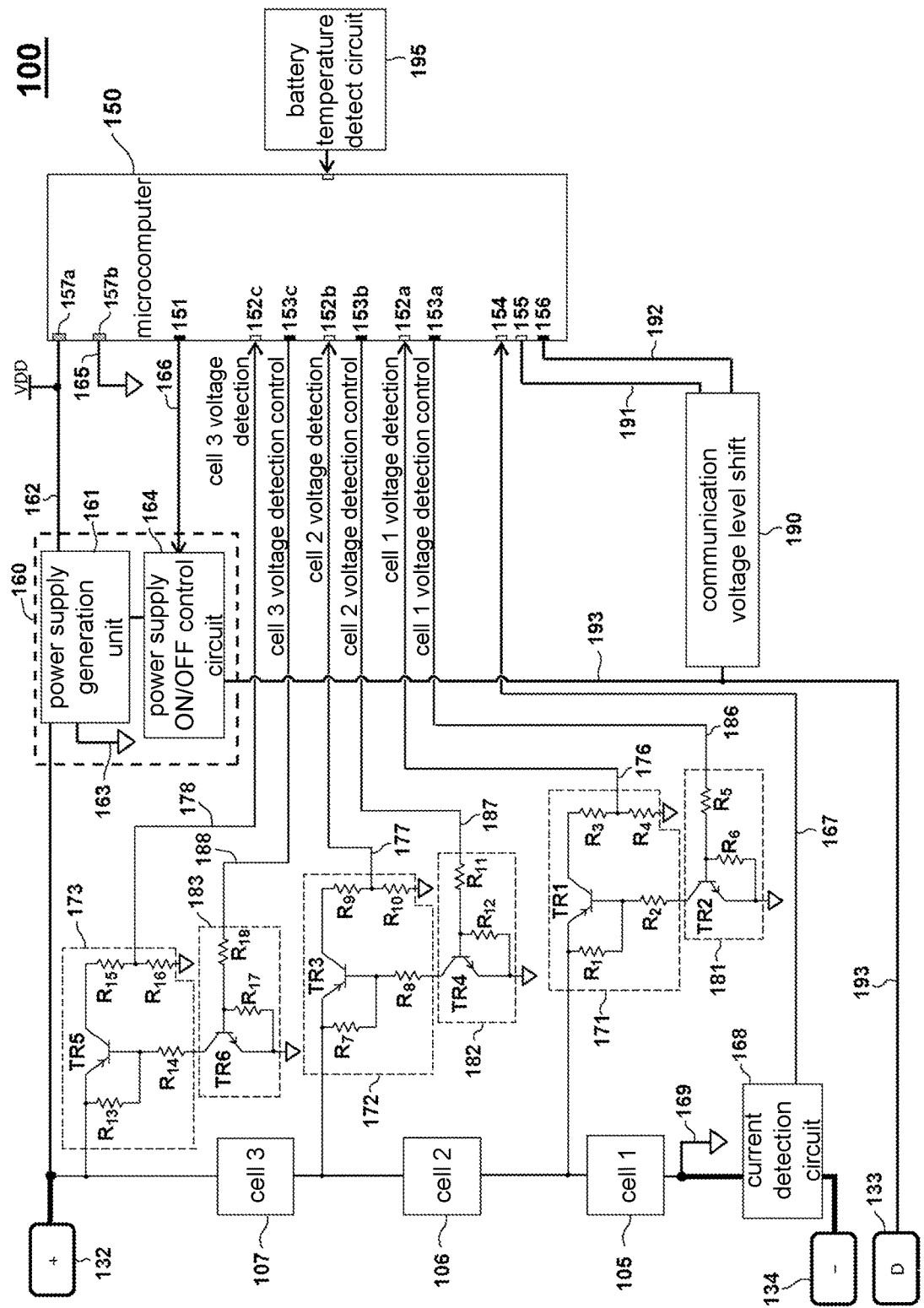
FIG. 6 is a circuit diagram of the battery pack 100 of the embodiment.

Next, the detailed circuit configurations of the first voltage detection circuit 171, the second voltage detection circuit 172 and the third voltage detection circuit 173, and the first circuit control unit 181, the second circuit control unit 182 and the third circuit control unit 183 are described with reference to the circuit diagram of FIG. 6. The first voltage detection circuit 171 mainly includes a transistor TR1 that performs a switching operation, the emitter of the transistor TR1 is connected to the positive electrode side of the first battery cell 105, and the collector of the transistor TR1 is grounded via voltage divider resistors R3 and R4. The intermediate point between the voltage divider resistors R3 and R4 is input to the input port 152a of the microcomputer 150 as the signal line 176 as a voltage detection signal of the first cell 105. The base of the transistor TR1 is grounded via a resistor R2 and a transistor TR2. The emitter of the transistor TR2 is connected to the base of the transistor TR1 via the resistor R2, and the emitter is grounded. The base of the transistor TR2 is connected to the signal line 186 via a resistor R5 and is connected to the output port 153a of the microcomputer 150. A resistor R6 is arranged in order to set an ON state between the emitter and the collector by applying the divided voltage of resistors R1 and R2 to the base of the transistor TR2 when the transistor TR2 is turned on. In addition, the resistor R1 is arranged in order to keep a stable OFF state of the TR1 between the emitter and the collector with 0 V between the emitter and the base when the base signal of the transistor TR1 is opened.

When a high signal is input from the microcomputer 150 to the first circuit control unit 181 via the signal line 186, the emitter and the collector of the transistor TR2 are conducted, and thereby a closed circuit of the first battery cell 105-the resistor R1-the resistor R2-the transistor TR2 is formed. In addition, the transistor TR1 is conducted by applying the divided voltage of the resistors R1 and R2 to the base of the transistor TR1. Then, because a closed circuit of the first battery cell 105-the transistor TR1-the resistor R3-the resistor R4 is formed, the divided voltage of the resistors R3 and R4 is input to the input port 152*a* of the microcomputer 150 as a first cell voltage via the signal line 176.

When the state of the signal line 186 goes from high to low or open, because the voltage between the base and the collector of the transistor TR2 becomes almost 0 V, the collector and the emitter of the TR2 are cut off. Then, because the base voltage of the transistor TR1 has no potential difference with respect to the emitter, the transistor TR1 is turned off, and the current from the battery cell 105 does not flow through the voltage divider resistors R3 and R4. Then, the signal line 176 comes into a state equal to the grounded state, and no voltage is applied to the input port 152*a*. As described above, the microcomputer 150 can input the output of the first voltage detection circuit 171 to the input port 152*a* via the signal line 176 only when the high signal is output via the signal line 186.

The configurations of the second voltage detection circuit 172 and the second circuit control unit 182 are the same as those of the first voltage detection circuit 171 and the first circuit control unit 181. However, the divided voltage applied to voltage divider resistors R9 and R10 is not the voltage of the second cell 106 but a divided voltage with respect to the combined voltage of the first battery cell 105 and the second cell 106. Similarly, the configurations of the third voltage detection circuit 173 and the third circuit control unit 183 are the same as those of the first voltage detection circuit 171 and the first circuit control unit 181. Besides, the divided voltage applied to voltage divider resistors R15 and R16 is a divided voltage with respect to the combined voltage of the three battery cells of the first battery cell 105 to the third battery cell 107.

With the circuit configuration as described above, the voltage detection circuit of the battery pack can be realized using a general-purpose microcomputer 150 having a plurality of input ports and a plurality of output ports. In addition, the individual voltage of each of the battery cells 105 to 107 can be calculated using the measured values of the three voltage detection circuits 171 to 173 of the microcomputer 150.

Next, the procedure of the voltage detection operation of the microcomputer 150 during charging using the external charger is described with reference to the flowchart of FIG. 7. First, when a predetermined DC voltage is input to the power supply circuit unit 160 via the signal line 193, the power supply ON/OFF control circuit 164 operates the power supply generation unit 161, and thereby the reference voltage VDD is supplied to the microcomputer 150 and the microcomputer 150 is activated (step 201). When the microcomputer 150 is activated, steps after step 202 are executed, and a series of these procedures can be executed by software by a program stored in the microcomputer 150 in advance. Immediately after the activation, the microcomputer 150 sets a period for voltage detection to "Pattern 4" as a "non-charging mode" in which the charging operation is not performed (steps 202 and 203). The content of "Pattern 4" is described later.

Next, the microcomputer 150 checks the input voltage of the D terminal 133, and determines whether data communication with an external device (a power tool main body and an external charger) is possible (step 204). When the data communication is possible, that is, when the microcomputer 150 is connected to the external device, it is determined whether the external device is an external charger (step 205). When the data communication is not possible in step 204, or when the external device is not a charger in step 205, the microcomputer 150 maintains the "non-charging mode" as the voltage detection operation (step 251). The control procedure of the microcomputer 150 in the "non-charging mode" is described later with reference to FIG. 8. When the external device capable of data communication is an external charger in step 205, the microcomputer 150 changes to a "charging mode" as the voltage detection operation (step 206). Next, the microcomputer 150 determines whether the charging of the battery cells 105 to 107 by external charging has been started based on the output from the current detection circuit 168 (step 207).

When the charging is started in step 207, the microcomputer 150 sets the voltage detection period to "Pattern 1", that is, sets the detection period to 5 seconds, the first voltage detection circuit 171, the second voltage detection circuit 172 and the third voltage detection circuit 173 are turned on to perform the voltage detection for 1 second of the 5 seconds, and during the remaining 4 seconds, no voltage detection is performed (step 208). Accordingly, in terms of the ratio of detection time windows, the voltage detection execution time by the voltage detection unit is controlled to be sufficiently shorter than the voltage detection stop time with the voltage detection execution: the voltage detection stop set to 4:1. When the charging is not started in step 207, the microcomputer 150 sets the voltage detection period to "Pattern 2", that is, sets the detection period to 30 seconds, the first voltage detection circuit 171, the second voltage detection circuit 172 and the third voltage detection circuit 173 are turned on to perform the voltage detection for 1 second of the 30 seconds, and during the remaining 29 seconds, no voltage detection is performed, so that the voltage detection execution time is further shortened (step 211).

Next, the microcomputer 150 determines whether the battery pack 100 is in a fully charged state from the voltage detected by the first voltage detection circuit 171, the second voltage detection circuit 172 and the third voltage detection circuit 173 (step 209). Whether the battery is fully charged is judged by whether any of the voltages of the battery cells 105 to 107 has reached an overcharge threshold value, which is determined by the microcomputer 150 using the outputs of the first voltage detection circuit 171, the second voltage detection circuit 172 and the third voltage detection circuit 173.

If the fully charged state has not been reached in step 209, the process returns to step 207, and when the fully charged state is reached, the microcomputer 150 sets the period for voltage detection to "Pattern 3" (step 210). "Pattern 3" for voltage detection is a control in which the voltage detection is not performed in the first voltage detection circuit 171, the second voltage detection circuit 172 and the third voltage detection circuit 173. In addition, the microcomputer 150 sends a charge stop signal to the charger side by using the LD terminal 135. With the above control, the charging mode of the battery pack 100 ends.

Next, the procedure of the voltage detection operation of the microcomputer 150 in the state of discharging from the battery pack (non-charging time) is described with reference to FIG. 8. The non-charging time is mainly a state in which the battery cell is mounted on the battery pack 100 but not mounted on the external charger (not shown) (step 201). Moreover, when the battery pack 100 is stored independently in a state of being removed, the microcomputer 150 is shut down, and thus the microcomputer 150 cannot detect the voltages of the battery cells 105 to 107 unless a start circuit for the microcomputer 150 is additionally arranged.

In the non-charging mode, the microcomputer 150 first sets the period for voltage detection to "Pattern 4" (step 252). "Pattern 4" for voltage detection has a detection period of 5 seconds, the first voltage detection circuit 171, the second voltage detection circuit 172 and the third voltage detection circuit 173 are turned on to perform the voltage detection for 1 second of the 5 seconds, and during the remaining 4 seconds, no voltage detection is performed. Next, the microcomputer 150 continues the not-in-use state in which the battery pack 100 has not been discharged, and when a preset set time (for example, a threshold value in the range of several seconds to several tens of minutes) is reached, the microcomputer 150 sends a self-stop signal from the output port 151 to stop the operation of the power supply circuit unit 160, and thereby the microcomputer 150 is shut down (step 256). Step 256 is executed in a case that, for example, the trigger lever 16a is not operated for a certain period of time after the microcomputer 150 of the battery pack 100 is activated when the battery pack 100 is mounted by a power tool 1.

If the predetermined time has not elapsed in step 253, the microcomputer 150 determines whether the battery pack 100 has been discharged, and if the state in which the battery pack 100 has not been discharged continues, that is, the state in which a trigger lever 6a of the impact tool 1 is not pulled continues, the process returns to step 252. If there is discharge in step 254, that is, the trigger lever 6a is pulled, the microcomputer 150 sets the period for voltage detection to "Pattern 5" (step 255). "Pattern 5" for voltage detection is a control in which the voltage detection is constantly performed in the first voltage detection circuit 171, the second voltage detection circuit 172 and the third voltage detection circuit 173.

Figure 7:
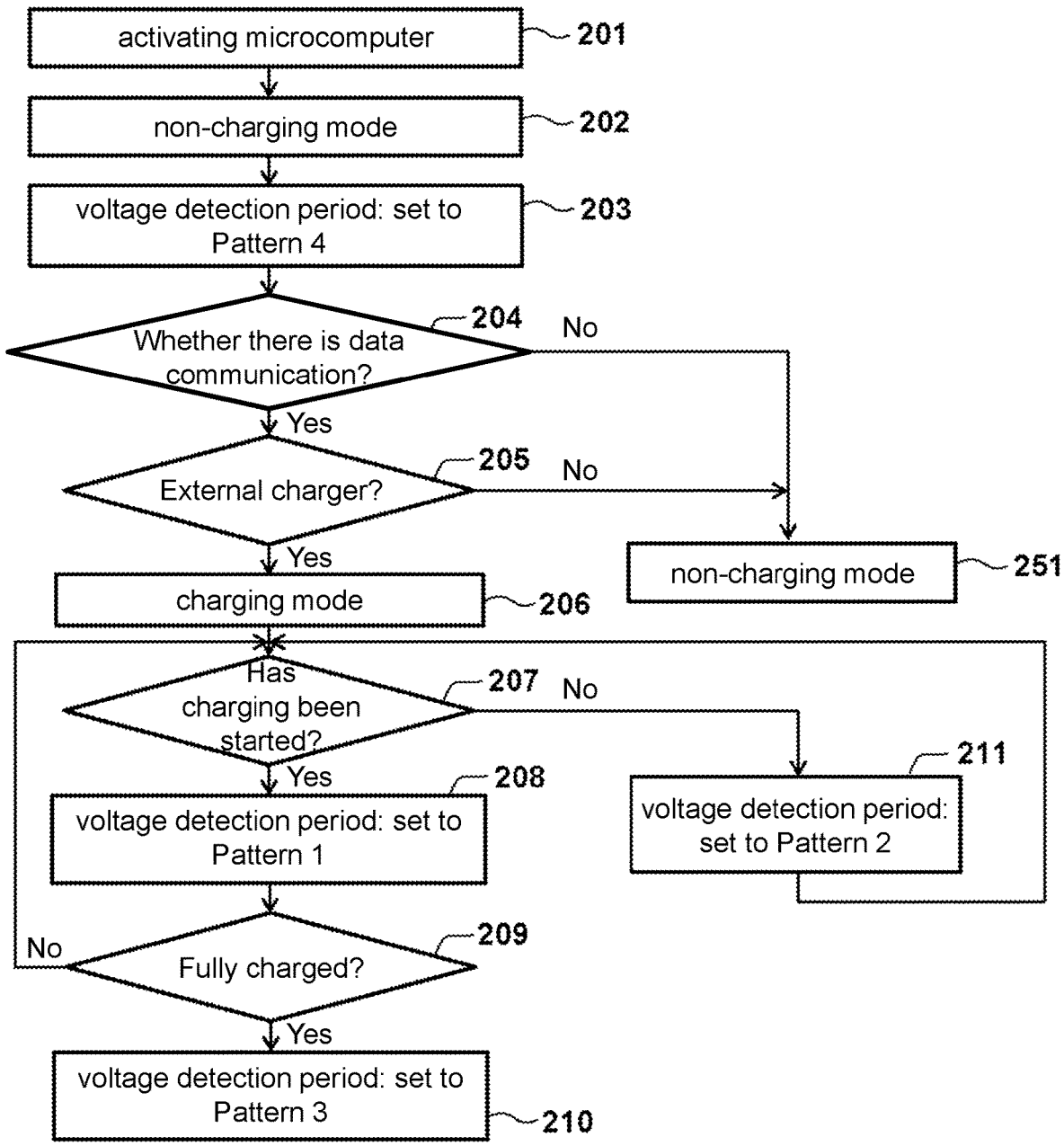
FIG. 7 is a flowchart showing a control procedure of a microcomputer 150 in a charging mode of the battery pack 100.
Figures 8, 9:
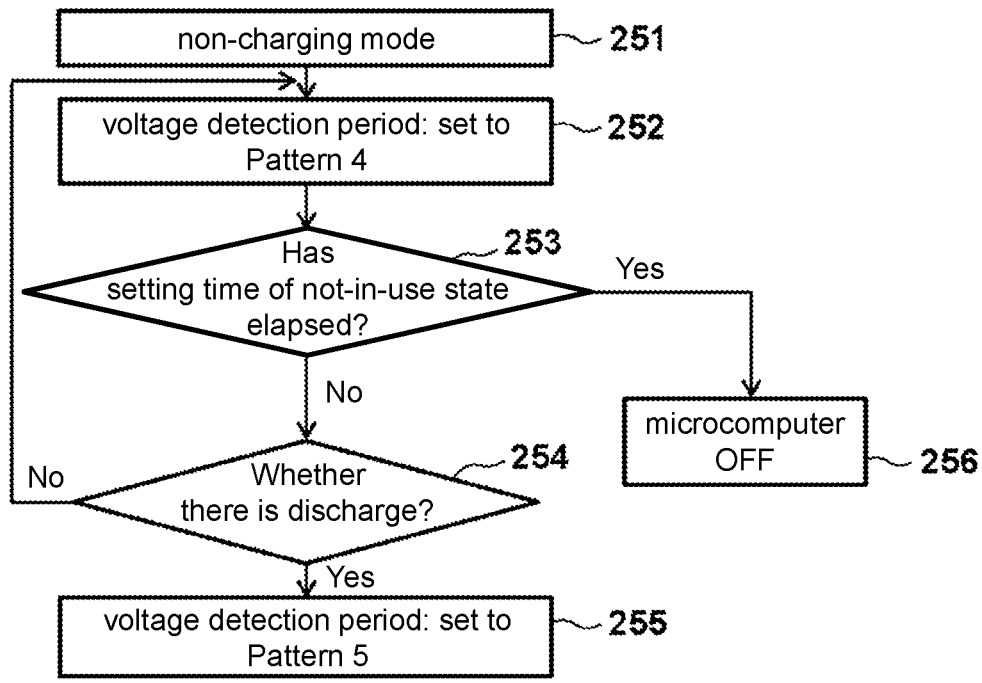
FIG. 8 is a flowchart showing a control procedure of the microcomputer 150 in a non-charging mode of the battery pack 100.
FIG. 9 is a table showing an example of a voltage detection period by the microcomputer 150 of the battery pack 100.

FIG. 9 is a table showing an example of the voltage detection period set by the microcomputer 150 of the battery pack 100, and lists the patterns shown in the flowcharts of FIG. 7 and FIG. 8. Here, the detection mode of the battery pack 100 is divided into two modes, "charging" and "non-charging". The "charging mode" is a mode when the battery pack 100 is mounted on the external charger, and the other modes are called the "non-charging mode". In the "charging mode", there are three control patterns of Patterns 1 to 3. Pattern 1 is used when detecting the voltage during charge execution, the detection period in Pattern 1 is set to 5 seconds, and the voltage detection is performed only for 1 second in a time window divided every 1 second. During the time window of the remaining 4 seconds, no voltage detection is performed. Pattern 2 is used when detecting the voltage in the high temperature atmosphere before the start of charging, the detection period in Pattern 2 is set to 30 seconds, and the voltage detection is performed only for 1 second in the time window divided every 1 second. Pattern 3 is a voltage detection mode after the charging is completed to reach a fully charged state and before the battery pack 100 is removed from the external charger. In Pattern 3, the voltage detection is not performed because the battery pack 100 is fully charged.

The "non-charging mode" is a mode when the battery pack 100 is not mounted on the external charger, and in this mode, the battery pack 100 is mounted on the main body of an electrical device, and the microcomputer 150 of the battery pack 100 is activated. In addition, the "non-charging mode" is a state immediately after the battery pack 100 is removed from the main body of the electrical device and before the microcomputer 150 shuts down. In a state in which the battery pack 100 is removed, once the microcomputer 150 is shut down, the "non-charging mode" is not executed because the microcomputer 150 cannot restart unless the battery pack 100 is mounted on the external device.

Pattern 4 of the "non-charging mode" is used for voltage detection when the battery pack 100 is mounted on the main body of the electrical device, the detection period in Pattern 4 is set to 5 seconds, and voltage detection is performed only in one of the five time windows divided every 1 second. During the remaining four time windows of four seconds, no voltage detection is performed. Pattern 5 is used for voltage detection when the trigger lever 6a of the main body of the electrical device is pulled (when the discharging is performed), and is a constant detection mode in which the voltage detection is performed in all time windows of the time windows divided every 1 second.

Next, the voltage detection timings in the first voltage detection circuit 171, the second voltage detection circuit 172 and the third voltage detection circuit 173 are described with reference to FIG. 10. In each of (A), (B) and (C) of FIG. 10, voltage control signals 186A, 187A and 188A indicate signal levels output to the signal lines 186, 187 and 188 from the output ports 153a to 153c of the microcomputer 150 shown in FIG. 6. The horizontal axis is a time axis and indicates time T (unit: second), and the vertical axis is a signal level (unit: V) and indicates whether it is a high level (high voltage) or a low level (low voltage or 0 V). When the voltage control signals (186A, 187A and 188A) are high, the voltage detection circuits (171 to 173) are operated by the corresponding circuit control units (181 to 183), and the outputs of the voltage divider resistors (R3 and R4, R9 and R10, R15 and R16) are input to the input ports 152a to 152c of the microcomputer 150 via the signal lines 176 to 178.

Figure 10:
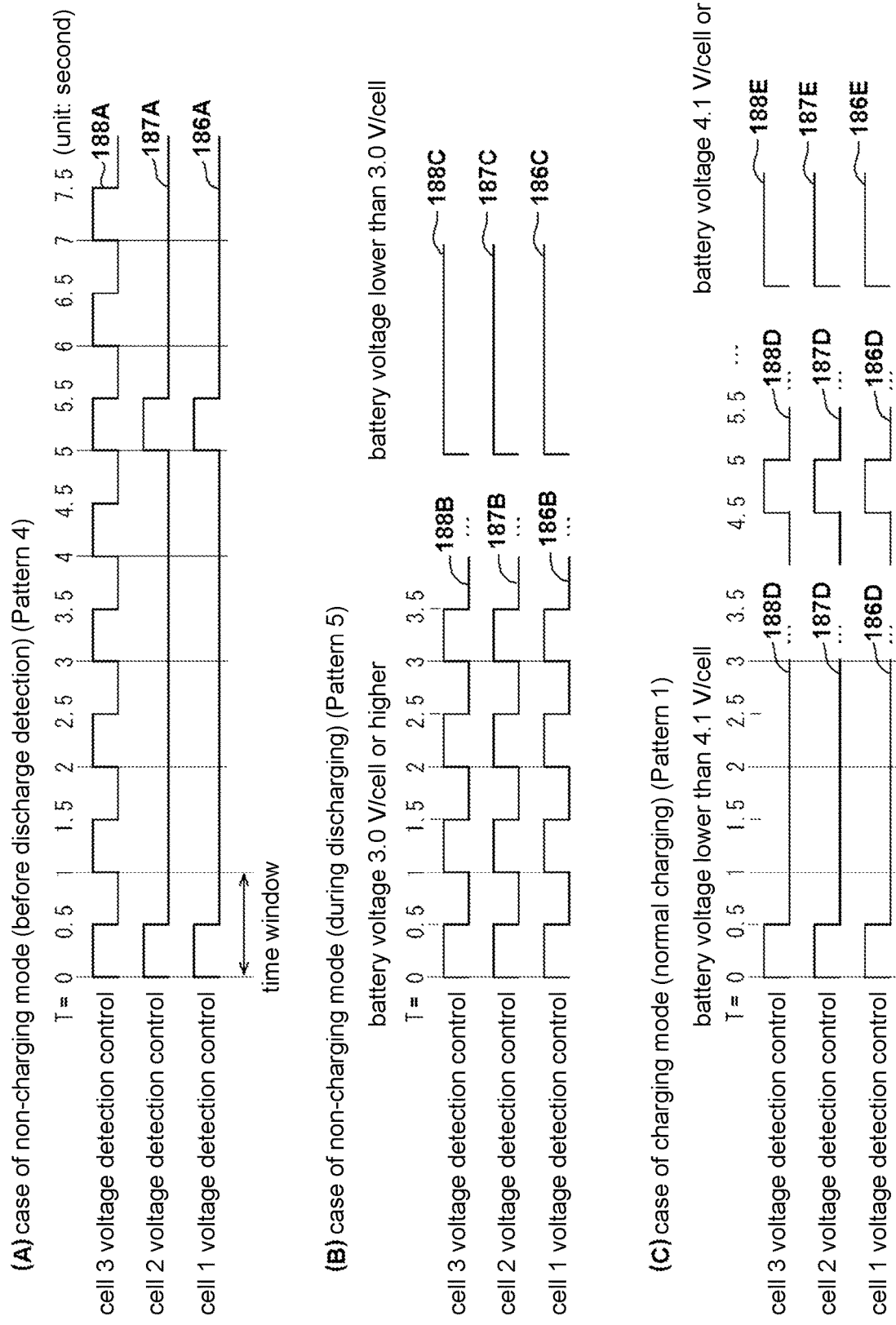
FIG. 10 is a timing chart of voltage detection by the microcomputer 150 of the battery pack 100.

(A) of FIG. 10 is the voltage detection control in "Pattern 4" of the "non-charging mode". Here, in the time window of 1 second unit, the voltage is detected in the first half part and the voltage detection is stopped in the latter half part. In the voltage control signals 186A and 187A, the voltage is detected in the time window of time 0 to 1 second and the time window of time 5 to 6 second. In these time windows, the voltage control signals 186A and 187A are set high for only 0.5 second of the first half, and turned off for 0.5 second in the latter half. When the voltage control signals 186A and 187A are turned on, the voltage detection is performed according to the reading period of the voltage detection of the microcomputer. For example, when the timing (period) of the voltage detection is every 1 millisecond, the voltage may be sequentially read every 1 millisecond and the average value of 256 ms may be used. On the other hand, the voltage control signal 188A switches between high and low in all time windows.

(B) of FIG. 10 is a control in "Pattern 5" of the "non-charging mode", and is a control in which detection on time is indicated as "constantly on" in FIG. 9. Here, for voltage control signals 186B, 187B and 188B, the voltage is detected in the first half part and the voltage detection is stopped in the latter half part in the time window of 1 second unit. However, this control is performed until the voltage of any of the battery cells becomes less than 3.0 V, and when the voltage becomes less than 3.0 V, the first voltage detection circuit 171, the second voltage detection circuit 172 and the third voltage detection circuit 173 are continuously operated to detect the voltage without setting the time window, as in voltage control signals 186C, 187C and 188C. When the voltage of any of the battery cells reaches a discharge stop threshold value voltage, the microcomputer 150 sends a stop instruction signal to the electrical device main body side via the LD terminal 135 (see FIG. 4). Moreover, although the discharge stop threshold value for switching the voltage detection to be continuously performed is set to 3.0 V here, the discharge stop threshold value is not limited to this voltage and may be appropriately set according to the type of the battery cell to be used.

(C) of FIG. 10 is a control in "Pattern 1" of the "charging mode". Here, for all of voltage control signals 186D, 187D and 188D, the voltage is detected in the first half part and the voltage detection is stopped in the latter half part in the time window of 1 second unit. However, this control is performed until the voltage of any of the battery cells rises to 4.1 V, and when the voltage becomes 4.1 V or more, the first voltage detection circuit 171, the second voltage detection circuit 172 and the third voltage detection circuit 173 are continuously operated to detect the voltage without setting the time window, as in voltage control signals 186E, 187E and 188E. When the voltage of any of the battery cells reaches a charge stop threshold value voltage, the microcomputer 150 sends a stop instruction signal to the external charger (not shown) via the LD terminal 135 (see FIG. 4). Moreover, although the charge stop threshold value for switching the voltage detection to be continuously performed is set to 4.1 V here, the charge stop threshold value is not limited to this voltage and may be appropriately set according to the type of the battery cell to be used.

As described above, according to the embodiment, because the voltage of each battery cell can be measured by a low-priced general-purpose microcomputer without using a dedicated protection IC for protecting the lithium-ion battery, the cost of the battery pack can be reduced. In addition, the voltage of each battery cell is divided below the power supply voltage of the microcomputer and input to the microcomputer, the power consumption of the circuit and the imbalance of each battery cell are suppressed, and thus a long-life battery pack that does not easily lose the balance of the battery cell can be realized. That is, when the voltage of each battery cell is constantly detected, the power consumption of each battery cell is different, and the battery cell 105 is discharged most thoroughly, followed by the battery cell 106. Therefore, by performing the voltage detection of the battery cells at different timings in each battery cell, the power consumed by the voltage detection circuit can be made different in each battery cell, and thus the occurrence of imbalance in each battery cell can be suppressed as compared with the case of constant detection.

Embodiment 2

In the battery pack 100 described in the first embodiment, because the input ports (152a to 152c) and the output ports (153a to 153c) are secured for the number of the battery cells used, a microcomputer with ports of more than twice the number of the battery cells is required. Generally, a microcomputer with a large number of terminals is more expensive and requires a large mounting space. Therefore, if the number of the battery cell is increased, mounting restrictions increase, which may lead to an increase in the size of the battery pack. Therefore, in order to reduce the number of the output port and the input port of the microcomputer, multiple functions that are different from each other are assigned to one input port (152), and the multiple functions are executed while switching in a time division manner, thereby reducing the number of the input port required.

Figure 11:
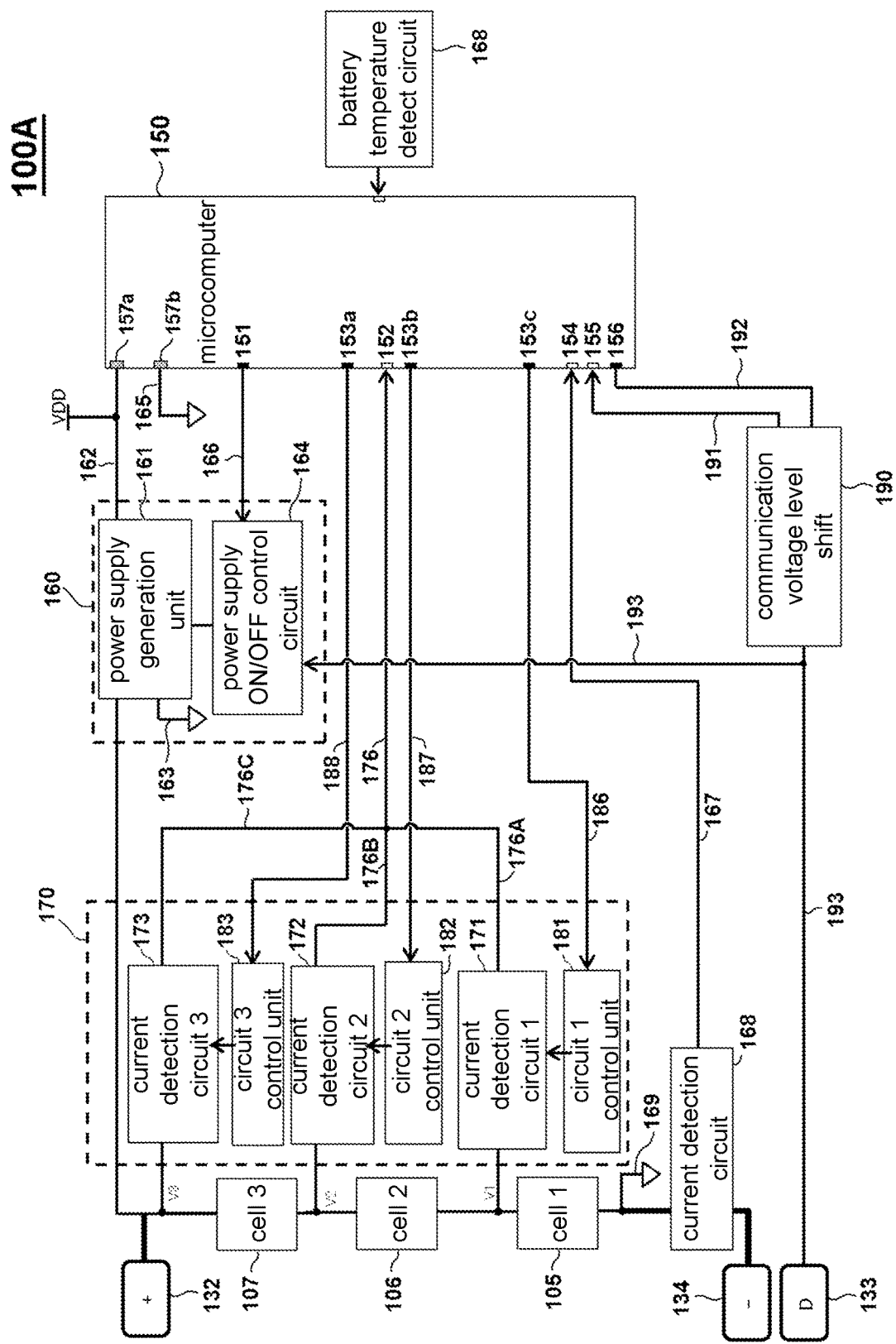
FIG. 11 is a circuit diagram of a battery pack 100A according to a second embodiment of the present invention.

FIG. 11 is a circuit diagram of a battery pack 100A having the microcomputer 150. The circuit diagram of FIG. 11 is substantially the same as the circuit diagram shown in FIG. 6, and the difference is that signal lines 176A, 177A and 178A from the first voltage detection circuit 171, the second voltage detection circuit 172 and the third voltage detection circuit 173 are put together and connected to the common input port 152 by one signal line 176. Therefore, voltage control signals 186F, 187F and 188F from the first voltage detection circuit 171, the second voltage detection circuit 172 and the third voltage detection circuit 173 are sequentially output so as not to overlap.

Figure 12:
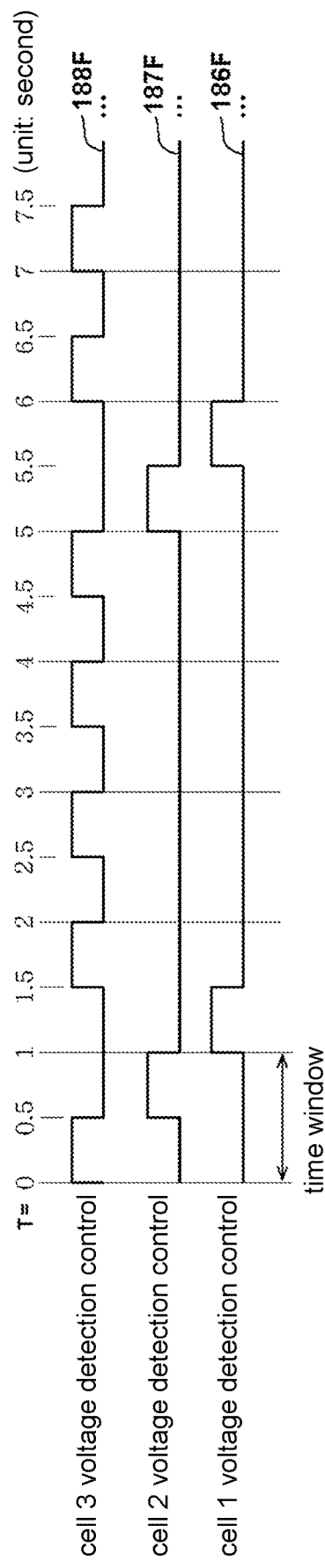
FIG. 12 is a timing chart of voltage detection by the microcomputer 150 of the battery pack 100A.
Figure 12:
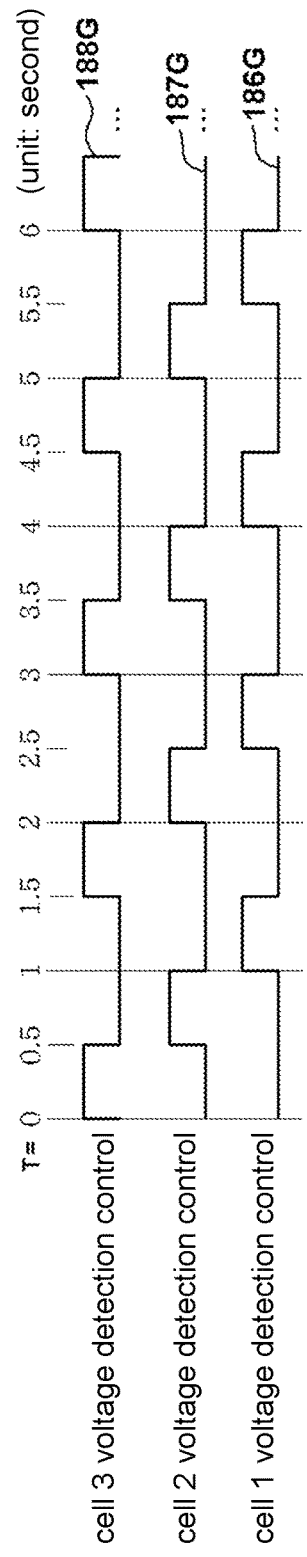

(A) of FIG. 12 is a timing chart of the voltage detection by the microcomputer 150 of the battery pack 100A during charging. In (A) of FIG. 12, the voltage control signals 186F and 187F are turned on at a time interval of 5 seconds, that is, between T=0 to 1 second and 5 to 6 second. In addition, the voltage control signal 188F is continuously detected, that is, the voltage control signal 188F is turned on alternately every 0.5 seconds. However, if the voltage control signals 186F to 188F are output in an overlapping manner, the outputs from the first voltage detection circuit 171, the second voltage detection circuit 172 and the third voltage detection circuit 173 are overlapped. Therefore, the microcomputer preferentially controlled the voltage control signals 186F to 188F in order that the voltage control signals 186F to 188F do not overlap. First, in the time window of 0 to 1 second, it is necessary to make any of the voltage control signals 186F to 188F appear. Therefore, only the voltage control signal 188F is turned on during the first T=0 to 0.5 second, only the voltage control signal 187F is turned on during the subsequent T=0.5 to 1 second, and only the voltage control signal 186F is turned on during the subsequent T=1 to 1.5 second. In the next time window, because the voltage control signal 186F has already been turned on in the first half part, only the voltage control signal 188F is turned on in the duration of T=1.5 to 2 second in which the voltage control signal 186F ends. In the time windows of 2 second, 3 second and 4 second, only the voltage control signal 188F is turned on. However, in the time window of 2 second, the voltage control signal 188F is turned on in the latter half part of the time window, and thus the interval is maintained and the voltage control signal 188F is caused to appear in the latter half part of the time windows of 2 second, 3 second and 4 second.

In a time window of 5 seconds, it is necessary to turn on any of the voltage control signals 186F to 188F. However, the voltage control signal 188F remains OFF in the first half part due to the time windows of 2 second, 3 second, and 4 second. Therefore, the voltage control signal 187F is turned on at T=5 to 5.5 second, the voltage control signal 186F is turned on at T=5.5 to 6 second, and the appearance of the voltage control signal 188F is restarted at T=6 second. As a result, the voltage control signal 187F does not appear in the time window of 5 seconds, but there is substantially no effect because a pause section of 0.5 seconds is substantially included. With this control, it is possible to input and process signals from three voltage detection circuits (171 to 173) using one input port 152.

(B) of FIG. 12 is a timing chart of the voltage detection by the microcomputer 150 of the battery pack 100A during discharging. During discharging, voltage control signals 188G, 187G and 186G are alternately turned on at an interval of 0.5 second, and this operation is repeated. By alternately performing the voltage detection in this way, the signal lines 176A, 177A and 178A can be input to the input port 152 of the microcomputer 150 as one signal line 176. Moreover, the voltage control signals 188G, 187G and 186G to be turned on are switched at an interval of 0.5 second, but the switching time interval is arbitrary, and the switching may be performed at a shorter interval or a longer interval.

Although the present invention has been described above based on the embodiments, the present invention is not limited to the above-described embodiments, and various modifications can be made without departing from the spirit of the present invention.

What is claimed is:

1. A battery pack, comprising: a plurality of battery cells connected in series; a plurality of voltage detection units which detect a voltage of each of the battery cells; and a control unit having a microcomputer which measures the voltages of the battery cells from the output of each of the voltage detection units, wherein
   switch control circuits configured to switch on or off the outputs from the voltage detection units to the microcomputer are respectively arranged on the plurality of voltage detection units,
   voltage divider circuits configured to divide the detected voltages into voltages lower than or equal to a power supply voltage of the control unit are respectively arranged on output sides of the voltage detection units,
   the plurality of battery cells comprise at least a first battery cell and a second battery cell from a ground side,
   the plurality of voltage detection units are connected to a common ground,
   a first voltage detection unit of the plurality of voltage detection units detects a voltage of only the first battery cell,
   a second voltage detection unit of the plurality of voltage detection units detects a combined voltage of the first battery cell and the second battery cell,
   the microcomputer is configured to measure the voltages of the battery cells from the voltages divided by the voltage divider circuits, and
   a time interval of voltage detection performed by the plurality of voltage detection units is changed for each of the voltage detection units according to a state of the battery pack.

2. The battery pack according to claim 1, wherein the plurality of battery cells further comprise a third battery cell;
   the voltage detection units further comprise a third voltage detection unit; and
   the third voltage detection unit detects a combined voltage from the first battery cell to the third battery cell.

3. The battery pack according to claim 1, wherein the microcomputer has output ports corresponding to the plurality of voltage detection units; and
   a plurality of the switch control circuits are capable of being switched independently.

4. The battery pack according to claim 1, wherein the microcomputer has a plurality of input ports respectively corresponding to the plurality of voltage detection units, or has one input port commonly connected to the plurality of voltage detection units; and
   a charge or discharge stop signal is output to an external electrical device main body or an external charger based on signals input to the input port.

5. The battery pack according to claim 1, wherein when the battery pack is being charged by an external charger, voltage detection execution time taken by the voltage detection unit is controlled to be shorter than voltage detection stop time.

6. The battery pack according to claim 1, wherein in a state that the battery pack is mounted on an external charger, a voltage detection interval of the voltage detection unit during charging execution is set to a time interval shorter than a voltage detection interval of the voltage detection unit during charging standby.

7. The battery pack according to claim 1, wherein after the charging of the battery pack is completed in the state that the battery pack is mounted on an external charger, the control unit does not detect the voltage by the voltage detection unit.

8. The battery pack according to claim 1, wherein during standby in which the battery pack is not discharged in a state that the battery pack is mounted on an electrical device main body, the voltage detection unit detects the voltage at a time interval shorter than voltage detection stop time.

9. The battery pack according to claim 1, wherein when the battery pack is being discharged in the state that the battery pack is mounted on an the electrical device main body, the voltage detection unit constantly detects the voltage at a regular interval.

10. An electrical device, which has a battery pack mounting unit for mounting the battery pack according to claim 1 and operates a work device by electric power from the battery pack.

11. A battery pack, comprising: a plurality of battery cells connected in series; a plurality of voltage detection units which detect a voltage of each of the battery cells; and a control unit having a microcomputer which measures the voltages of the battery cells from the output of each of the voltage detection units, wherein
   switch control circuits configured to switch on or off the outputs from the voltage detection units to the microcomputer are respectively arranged on the plurality of voltage detection units,
   voltage divider circuits configured to divide the detected voltages into voltages lower than or equal to a power supply voltage of the control unit are respectively arranged on output sides of the voltage detection units,
   the microcomputer has the same number of input ports respectively connected to the voltage detection units as the number of the battery cells, and has the same number of output ports respectively connected to the switch control circuits as the number of the battery cells.

12. A battery pack, comprising: a plurality of battery cells connected in series; a plurality of voltage detection units which detect a voltage of each of the battery cells; and a control unit having a microcomputer which measures the voltages of the battery cells from the output of each of the voltage detection units, wherein
   switch control circuits for switching on or off the outputs from the voltage detection units to the microcomputer are respectively arranged on the plurality of voltage detection units,
   voltage divider circuits dividing the detected voltages into voltages lower than or equal to a power supply voltage of the control unit are respectively arranged on output sides of the voltage detection units,
   the plurality of battery cells comprise at least a first battery cell, a second battery cell, and a third battery cell from a ground side,
   the plurality of voltage detection units are connected to a common ground,
   a first voltage detection unit of the plurality of voltage detection units detects a voltage of only the first battery cell,
   a second voltage detection unit of the plurality of voltage detection units detects a combined voltage of the first battery cell and the second battery cell,
   a third voltage detection unit of the plurality of voltage detection units detects a combined voltage from the first battery cell to the third battery cell, the microcomputer unevenly detects the voltage by the first to third voltage detection units.

* * * * *